(12) United States Patent
Akiyama et al.

(10) Patent No.: US 11,606,073 B2
(45) Date of Patent: Mar. 14, 2023

(54) METHOD OF PRODUCING COMPOSITE SUBSTRATE FOR SURFACE ACOUSTIC WAVE DEVICE

(71) Applicant: SHIN-ETSU CHEMICAL CO., LTD., Tokyo (JP)

(72) Inventors: Shoji Akiyama, Gunma (JP); Masayuki Tanno, Gunma (JP); Shozo Shirai, Gunma (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 981 days.

(21) Appl. No.: 16/318,966

(22) PCT Filed: May 23, 2017

(86) PCT No.: PCT/JP2017/019181
§ 371 (c)(1),
(2) Date: Jan. 18, 2019

(87) PCT Pub. No.: WO2018/016169
PCT Pub. Date: Jan. 25, 2018

(65) Prior Publication Data
US 2019/0280666 A1 Sep. 12, 2019

(30) Foreign Application Priority Data
Jul. 20, 2016 (JP) .............................. JP2016-142751

(51) Int. Cl.
*H03H 3/08* (2006.01)
*H03H 9/02* (2006.01)
(Continued)

(52) U.S. Cl.
CPC .......... *H03H 3/08* (2013.01); *H03H 9/02574* (2013.01); *H03H 9/02614* (2013.01);
(Continued)

(58) Field of Classification Search
CPC ............. H03H 3/08; H03H 2003/0414; H03H 9/02574; H03H 9/02641; H03H 2003/0407; C08G 77/02
See application file for complete search history.

(56) References Cited

U.S. PATENT DOCUMENTS 5,717,051 A * 2/1998 Hiraoka ................ C08G 77/02
525/437
8,866,365 B2 10/2014 Hori et al.
(Continued)

FOREIGN PATENT DOCUMENTS

EP 0726649 8/1996
EP 2 736 169 5/2014
(Continued)

OTHER PUBLICATIONS

Machine Translation of Japanese Patent Publication, JP 2001-53579, Dec. 2021. (Year: 2021).*
(Continued)

*Primary Examiner* — A. Dexter Tugbang
(74) *Attorney, Agent, or Firm* — Greenblum & Bernstein, P.L.C.

(57) ABSTRACT

Provided is a composite substrate for surface acoustic wave device which does not cause peeling of an entire surface of a piezoelectric single crystal film even when heating the film to 400° C. or higher in a step after bonding. The composite substrate is formed by providing a piezoelectric single crystal substrate and a support substrate, forming a film made of an inorganic material on at least one of the piezoelectric single crystal substrate and the support substrate, and joining the piezoelectric single crystal substrate with the support substrate so as to sandwich the film made of the inorganic material.

19 Claims, 15 Drawing Sheets

(51) Int. Cl.
H03H 3/04 (2006.01)
C08G 77/02 (2006.01)

(52) U.S. Cl.
CPC ..... *C08G 77/02* (2013.01); *H03H 2003/0407* (2013.01); *H03H 2003/0414* (2013.01)

(56) References Cited

U.S. PATENT DOCUMENTS

| | | |
|---|---|---|
| 2004/0259326 A1 | 12/2004 | Hideo |
| 2012/0086312 A1 | 4/2012 | Kobayashi et al. |
| 2014/0017565 A1 | 1/2014 | Byun et al. |
| 2014/0130319 A1* | 5/2014 | Iwamoto ............... H03H 3/08 29/25.35 |
| 2014/0145558 A1* | 5/2014 | Hori ............... H03H 3/08 310/313 R |
| 2015/0008789 A1 | 1/2015 | Iwamoto |

FOREIGN PATENT DOCUMENTS

| | | |
|---|---|---|
| EP | 2832537 | 2/2015 |
| JP | H08-222990 | 8/1996 |
| JP | 2001-053579 A | 2/2001 |
| JP | 2004-311955 | 11/2004 |
| JP | 2009-267665 | 11/2009 |
| JP | 2010069394 | 4/2010 |
| JP | 2011019043 A * | 1/2011 |
| JP | 2013-226829 | 11/2013 |
| JP | 2014156372 A | 8/2014 |
| JP | 2015223823 A | 12/2015 |
| KR | 2012-0035900 A | 4/2012 |
| WO | 2013/146374 A1 | 10/2013 |
| WO | 2014/027538 A1 | 2/2014 |

OTHER PUBLICATIONS

S. Inoue and M. Solal, "Spurious Free SAW Resonators on Layered Substrate with Ultra-High Q, High Coupling and Small TCF," 2018 IEEE International Ultrasonics Symposium (IUS), 2018, pp. 1-9, doi: 10.1109/ULTSYM.2018.8579852. (Year: 2018).*

Taiyo Yuden Co., Ltd., "Temperature Compensation Technology for SAW-Duplexer Used in RF Front End Smartphone", Dempa Shimbun High Technology, Nov. 2012.

Kobayashi et al., "A Study on Temperature-Compensated Hybrid Substrates for Surface Acoustic Wave Filters", IEEE International Ultrasonics Symposium Proceedings, vol. 1, Oct. 2010, pp. 637-640.

International Search Report issued with respect to Patent Application No. PCT/JP2017/019181, dated Aug. 22, 2017, along with an English translation thereof.

International Preliminary Report on Patentability for PCT/JP2017/019181, dated Jan. 22, 2019, along with an English translation thereof.

Office Action issued in Republic of Korea Counterpart Patent Appl. No. 10-2019-7000149, dated Jun. 24, 2021, along with an English translation thereof.

Extended European Search Report for European Application No. 17830689.0, dated Mar. 3, 2020.

JP Office Action dated Jun. 25, 2019 for JP Application No. 2016-142751, and English-language translation.

* cited by examiner (a) (b)

(a)

(b)

METHOD OF PRODUCING COMPOSITE SUBSTRATE FOR SURFACE ACOUSTIC WAVE DEVICE

TECHNICAL FIELD

The present invention relates to a method of producing a composite substrate for surface acoustic wave device.

BACKGROUND ART

In recent years, in the market of mobile communications typified by smartphones, data traffic has been rapidly increased. As the number of bands required to cope with this problem is increased, it is inevitably indispensable to miniaturize various parts and to achieve high performance of the parts. Typical piezoelectric materials such as lithium tantalate ($LiTaO_3$, hereinafter referred to as "LT") and lithium niobate ($LiNbO_3$, hereinafter referred to as "LN") are widely used as materials for surface acoustic wave (SAW) devices. However, although the materials have a large electromechanical coupling coefficient and the bandwidth can be broadened, there is a problem that the temperature stability of the materials is low, and so the adaptable frequency is shifted by the temperature change. This is because lithium tantalate or lithium niobate has a very high thermal expansion coefficient.

In order to reduce the problem, there has been proposed a method including bonding a material having a low thermal expansion coefficient to one surface of LT or LN as a piezoelectric material and grinding the other surface so as to be thinned to a thickness of several μm to several tens μm (Non Patent Document 1). In this method, materials having a low thermal expansion coefficient (such as sapphire and silicon) are bonded to each other so that thermal expansion of LT or LN is suppressed and the temperature characteristics is improved. FIG. 14 shows a graph of the thermal expansion coefficients of various materials.

However, the method has another problem that an LT film or an LN film (i.e., a thin piezoelectric single crystal film) is laminated on a support substrate (i.e., a material having a low thermal expansion coefficient), whereby a noise called spurious or ripple occurs in the antiresonant frequency band. FIG. 15(*a*) is a graph showing S11 characteristics (reflection characteristics) of a four-stage ladder filter produced on a composite substrate made of a 20 μm-thick LT film laminated on Si, and FIG. 15(*b*) is a graph showing S12 characteristics (insertion loss characteristics). In FIG. 15(*b*), the ripple of S11 shown in FIG. 15(*a*) is generated at the frequency above the pass band where the insertion loss decreases. The difference between peaks and valleys of the ripple of S11 is defined as amplitude.

Non Patent Document 2 proposes a method for solving the problem. In the method, the bonded surface of LT is roughened with a No. 1000 grinding stone to obtain a roughness of 300 nm as Ra (arithmetic average roughness), and then the LT is bonded to a support substrate using an adhesive. However, according to the method of Non Patent Document 2, bonding is performed using an adhesive of an organic substance. Accordingly, there is a problem from the viewpoint of reliability. Specifically, a plurality of steps of patterning the surface of the substrate after bonding, dicing the substrate, and mounting a chip on a device is scheduled, and a heat treatment (heating to 250 to 400° C.) is repeated in the process. As a result, the organic substance constituting the adhesive is deteriorated, which causes problems such as peeling and cracking of the piezoelectric single crystal film of the bonded substrate.

PRIOR ART REFERENCES

Non Patent Documents

Non Patent Document 1: Taiyo Yuden Co., Ltd. "Temperature Compensation Technology for SAW-Duplexer Used in RF Front End of Smartphone", Dempa Shimbun High Technology, November 2012

Non Patent Document 2: H. Kobayashi et al., "A study on Temperature-Compensated Hybrid Substrates for Surface Acoustic Wave Filters", IEEE International Ultrasonics Symposium, 2010, Vol. 1, p. 637-640

SUMMARY OF THE INVENTION

Problems to be Solved by the Invention

An object of the present invention is to provide a method of producing a composite substrate for surface acoustic wave device which does not cause peeling of an entire surface of a piezoelectric single crystal film even when heating the film to 400° C. or higher in a step after bonding.

Means for Solving the Problems (1) In the method of producing a composite substrate for surface acoustic wave device according to the present invention, a composite substrate is formed by providing a piezoelectric single crystal substrate and a support substrate, forming a film made of an inorganic material on at least one of the piezoelectric single crystal substrate and the support substrate, and joining the piezoelectric single crystal substrate with the support substrate so as to sandwich the film made of the inorganic material.

In the present invention, the piezoelectric single crystal film is joined with the support substrate using the inorganic material film formed between the piezoelectric single crystal film and the support substrate in place of an adhesive. As a result, even when the joined body is heated to 400° C. or higher in the process after joining, it is possible to prevent the entire surface of the piezoelectric single crystal film from peeling off, unlike the case where the piezoelectric single crystal film is joined with the support substrate using the adhesive.

(2) An uneven structure may be formed on at least one of the piezoelectric single crystal substrate and the support substrate, and a film made of an inorganic material may be formed on the uneven structure. The occurrence of spurious can be reduced by forming the uneven structure.

(3) A roughness Ra of the uneven structure is equal to or more than 100 nm or more so that the occurrence of spurious can be effectively reduced.

(4) A numerical value of roughness RSm/wavelength, which is a ratio of a roughness RSm of the uneven structure to a wavelength when the substrate is used as a surface acoustic wave device, is equal to or more than 0.2 and equal to or less than 7 so that the occurrence of spurious can be more effectively reduced.

(5) Prior to joining of the piezoelectric single crystal substrate and the support substrate, in which a film made of an inorganic material is formed on at least one of the piezoelectric single crystal substrate and the support substrate, respective surfaces of the substrates to be joined are flattened, thereby making it easy to join the substrates.

(6) At least one of the flattened surfaces to be joined is subjected to a surface activation treatment, thereby making it easier to join the surfaces.

(7) As the surface activation treatment to be applied, for example, an ozone water treatment, a UV ozone treatment, an ion beam treatment or a plasma treatment is preferable.

(8) The inorganic material film can be formed by, for example, a chemical vapor deposition method.

(9) In the chemical vapor deposition method, a film can be effectively formed using a reaction gas containing silane.

(10) The inorganic material film may be formed by a physical vapor deposition method.

(11) When a magnetron sputtering method is used as the physical vapor deposition method, since a highly dense film is obtained, it is not necessary to perform a densification process, and thus it is possible to prevent occurrence of warping of the substrate due to relaxation of stress after the densification process.

(12) When the inorganic material film is formed under high temperature, warping and cracking are likely to occur as the temperature is returned to room temperature, and thus the film may be formed at a low temperature of 70° C. or lower.

(13) A volume shrinkage rate of the formed inorganic material film when heated to a temperature of from 400 to 600° C. is equal to or less than 10%, so that it is possible to make it difficult for the piezoelectric single crystal film to peel off.

(14) The inorganic material film may be formed by applying an organosilicon compound solution to a surface on which the uneven structure is formed, and curing and firing the solution.

(15) Since the purpose of curing the organosilicon compound at the time of film formation is to volatilize the solvent and the curing is just pre-curing, it is preferable to cure the organosilicon compound, for example, at a low temperature of 250° C. or lower.

(16) The organosilicon compound at the time of film formation is fired preferably at a temperature of, for example, 600° C. or lower so that the piezoelectric single crystal film is not easily peeled off due to excessive volume shrinkage.

(17) A volume shrinkage rate during a period of curing the organosilicon compound and firing the organosilicon compound is equal to or less than 10%, so that it is possible to make it difficult for the piezoelectric single crystal film to peel off.

(18) The organosilicon compound capable of reducing the volume shrinkage rate to equal to or less than 10% is, for example, an organosilicon compound containing perhydropolysilazane or methyltrimethoxysilane.

(19) For example, lithium tantalate and lithium niobate are preferable as the material of the piezoelectric single crystal substrate.

(20) For example, silicon, silicon with an oxide film, glass, quartz, alumina, sapphire, silicon carbide, and silicon nitride are preferable as the material of the support substrate.

(21) For example, $SiO_x$ (x=2±0.5), SiON, SiN, amorphous Si, polycrystalline Si, and amorphous SiC are preferable as the inorganic material to be formed as a film.

DESCRIPTION OF EMBODIMENTS

The method of producing a composite substrate for surface acoustic wave device of the present invention is a method including bonding a piezoelectric single crystal substrate to a support substrate with an inorganic material film interposed therebetween to produce a composite substrate. The method may include the following three methods depending on the mode of formation of the uneven structure.

Figure 1:
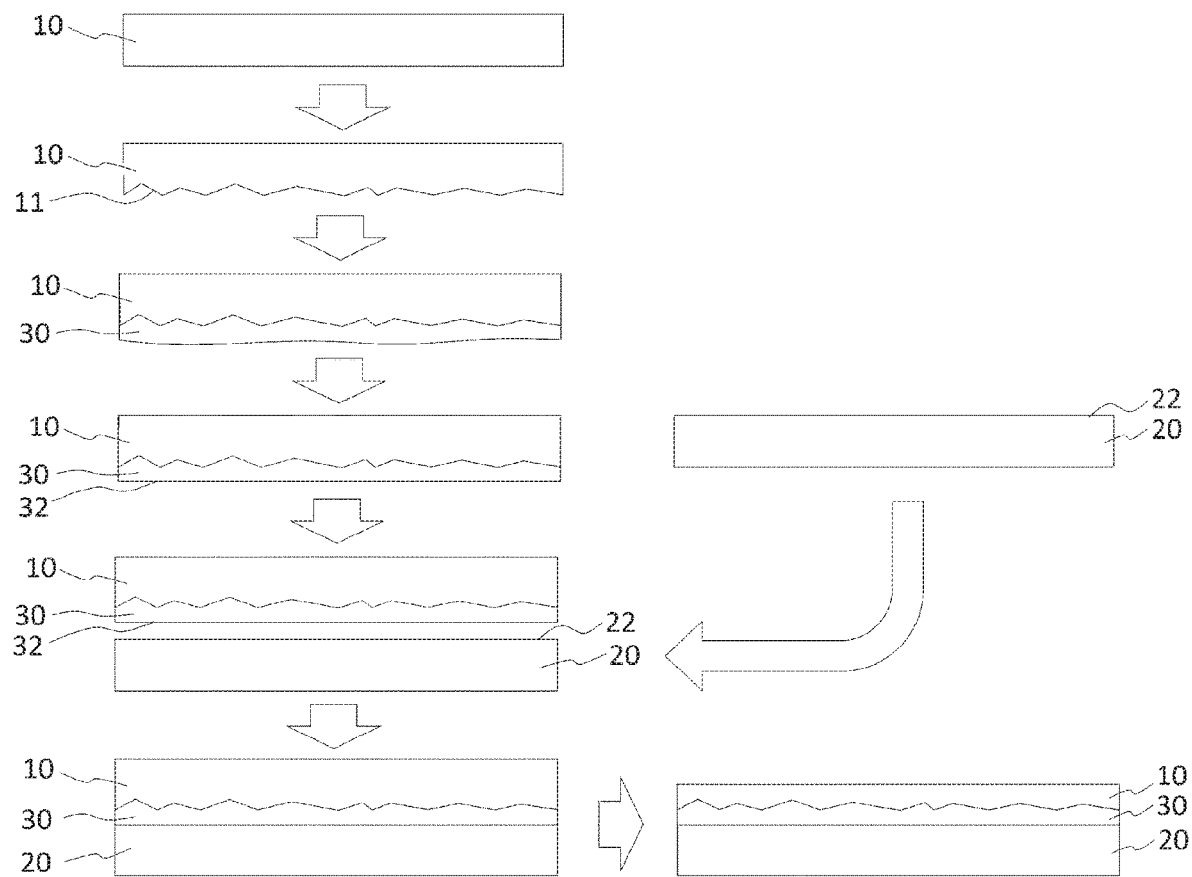
FIG. 1 is a view for explaining a first production method of the present invention.

A first production method will be described with reference to FIG. 1. In the first production method, an uneven structure 11 is formed on a piezoelectric single crystal substrate 10 made of a lithium tantalate substrate or a lithium niobate substrate, and no uneven structure is formed on a support substrate 20 made of silicon, silicon with an oxide film, glass, quartz, alumina, sapphire, silicon carbide or silicon nitride. The uneven structure on the piezoelectric single crystal substrate 10 can be formed by, for example, polishing the substrate with free abrasive grains. An inorganic material film 30 made of an inorganic material such as $SiO_x$ (x=2±0.5), SiON, SiN, amorphous Si, polycrystalline Si or amorphous SiC is formed on the surface on which the uneven structure of the piezoelectric single crystal substrate 10 is formed, and the inorganic material film 30 is flattened.

Then, at least one of a flattened surface 32 of the inorganic material film 30 and a flat surface 22 previously formed on the support substrate 20 is subjected to a surface activation treatment. After that, the flattened surface 32 of the inorganic material film 30 and the flat surface 22 of the support substrate 20 are joined with each other, the portion of the piezoelectric single crystal substrate 10 of the joined body is polished to be thinned, and the composite substrate is completed.

Figure 2:
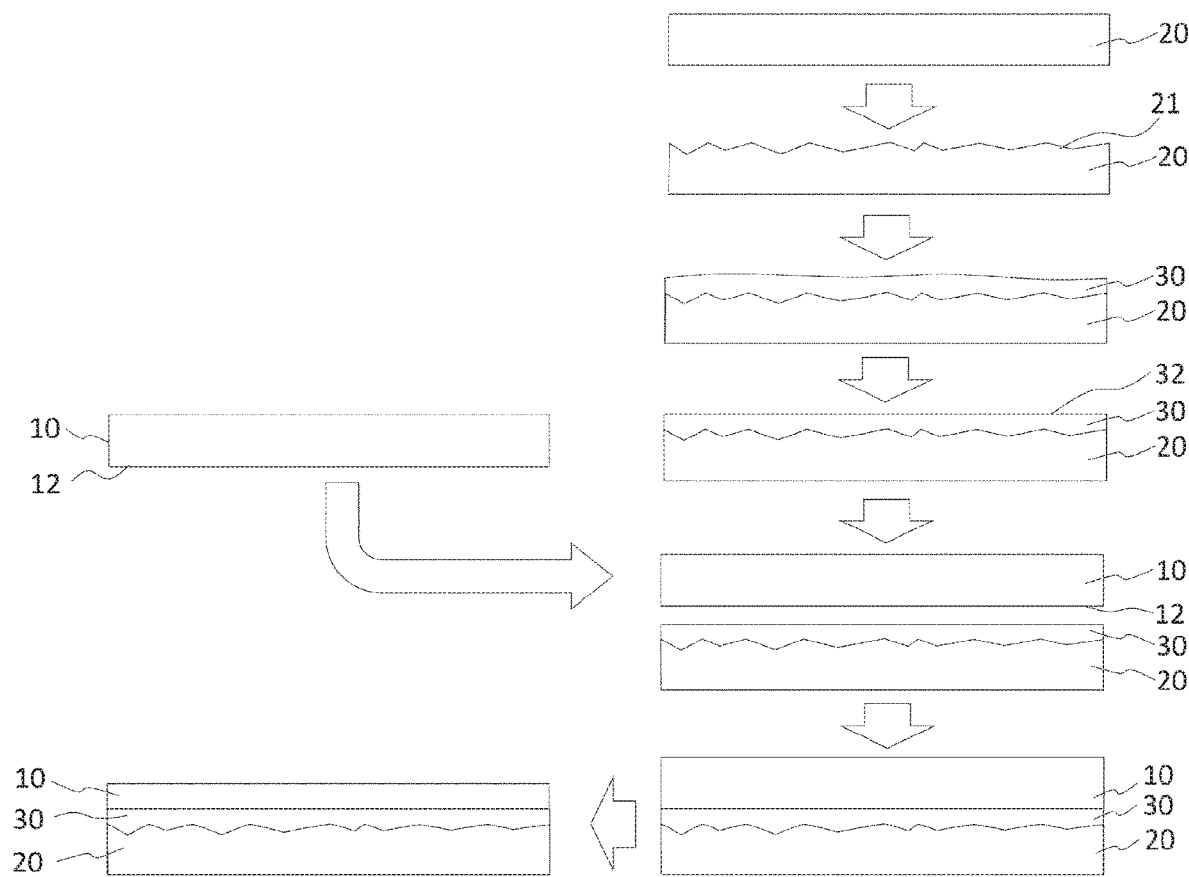
FIG. 2 is a view for explaining a second production method of the present invention.

A second production method will be described with reference to FIG. 2. In the second production method, an uneven structure 21 is formed on the support substrate 20 made of silicon, silicon with an oxide film, glass, quartz, alumina, sapphire, silicon carbide or silicon nitride, and no uneven structure is formed on the piezoelectric single crystal substrate 10 made of a lithium tantalate substrate or a lithium niobate substrate. The uneven structure on the support substrate 20 can be formed by, for example, immersing the substrate in a sodium hydroxide solution. The inorganic material film 30 made of an inorganic material such as SiOx (x=2±0.5), SiON, SiN, amorphous Si, polycrystalline Si or amorphous SiC is formed on the surface on which the uneven structure of the support substrate 20 is formed, and the inorganic material film 30 is flattened. Then, at least one of the flattened surface 32 of the inorganic material film 30 and a flat surface 12 previously formed on the piezoelectric single crystal substrate 10 is subjected to a surface activation treatment. After that, the flattened surface 32 of the inorganic material film 30 and the flat surface 12 of the piezoelectric single crystal substrate 10 are joined with each other, the portion of the piezoelectric single crystal substrate 10 of the joined body is polished to be thinned, and the composite substrate is completed.

Figure 3:
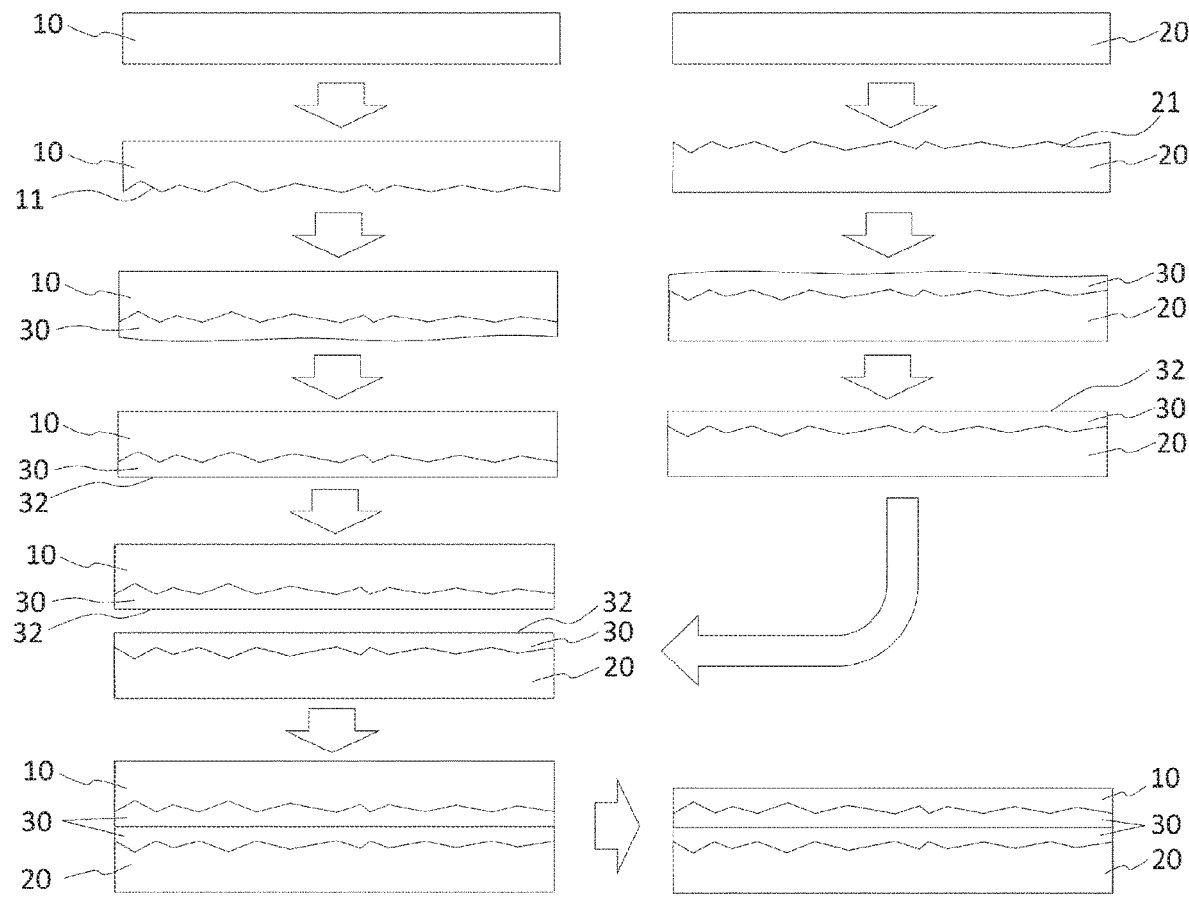
FIG. 3 is a view for explaining a third production method of the present invention.

A third production method will be described with reference to FIG. 3. In the third production method, the uneven structure 11 is formed on the piezoelectric single crystal substrate 10 made of a lithium tantalate substrate or a lithium niobate substrate, and the uneven structure 21 is formed on the support substrate 20 made of silicon, silicon with an oxide film, glass, quartz, alumina, sapphire, silicon carbide or silicon nitride. The inorganic material films 30 made of an inorganic material such as SiOx (x=2±0.5), SiON, SiN, amorphous Si, polycrystalline Si or amorphous SiC are formed on the surface on which the uneven structure of the piezoelectric single crystal substrate 10 is formed and the surface on which the uneven structure of the support substrate 20 is formed, respectively. Then, the inorganic material films 30 are flattened. Thereafter, at least one of the flattened surfaces 32 of the inorganic material films 30 is subjected to a surface activation treatment. After that, the flattened surfaces 32 of the inorganic material films 30 are joined with each other, the portion of the piezoelectric single crystal substrate 10 of the joined body is polished to be thinned, and the composite substrate is completed.

The piezoelectric single crystal film is joined with the support substrate using the inorganic material film formed between the piezoelectric single crystal film and the support substrate in place of the adhesive, so that even when the joined body is heated to 400° C. or higher in the process after joining, it is possible to prevent the entire surface of the piezoelectric single crystal film from peeling off, unlike the case where the piezoelectric single crystal film is joined with the support substrate using the adhesive. Further, the occurrence of spurious can be reduced by forming the uneven structure. Particularly, the roughness Ra of the uneven structure is set to equal to or more than 100 nm so that the occurrence of spurious can be effectively reduced.

Further, in the case where the Ra is equal to or more than 100 nm, the controlling of the unevenness pitch is more effective in controlling the magnitude of spurious than the controlling of Ra.

Figure 4:
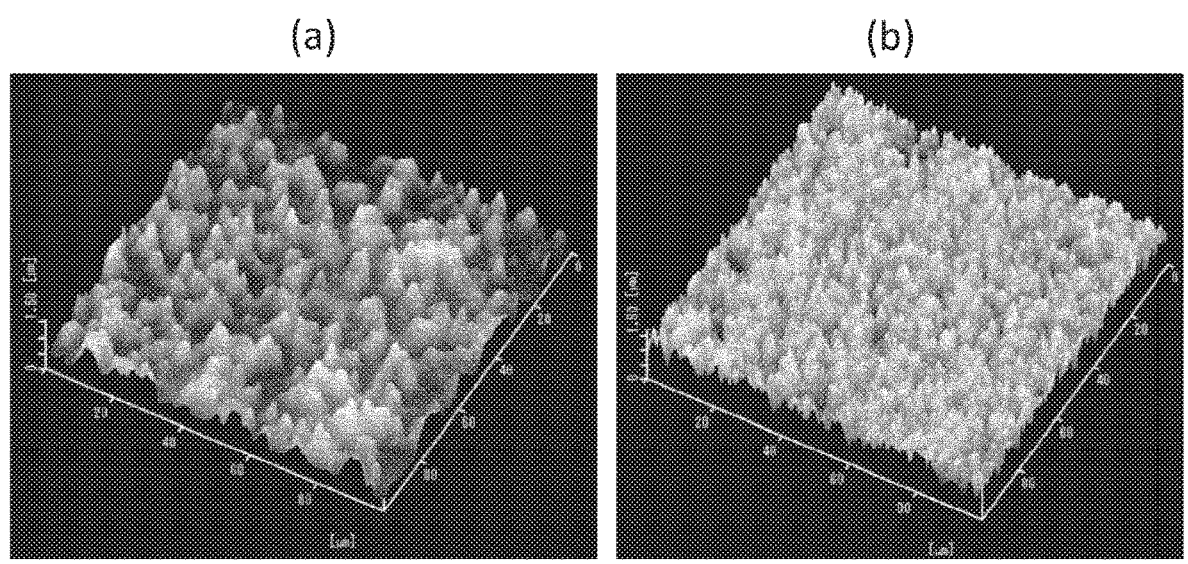
FIG. 4 shows views showing examples of rough surfaces having the same degree of the arithmetic average roughness Ra and different degrees of the roughness RSm.
Figure 5:
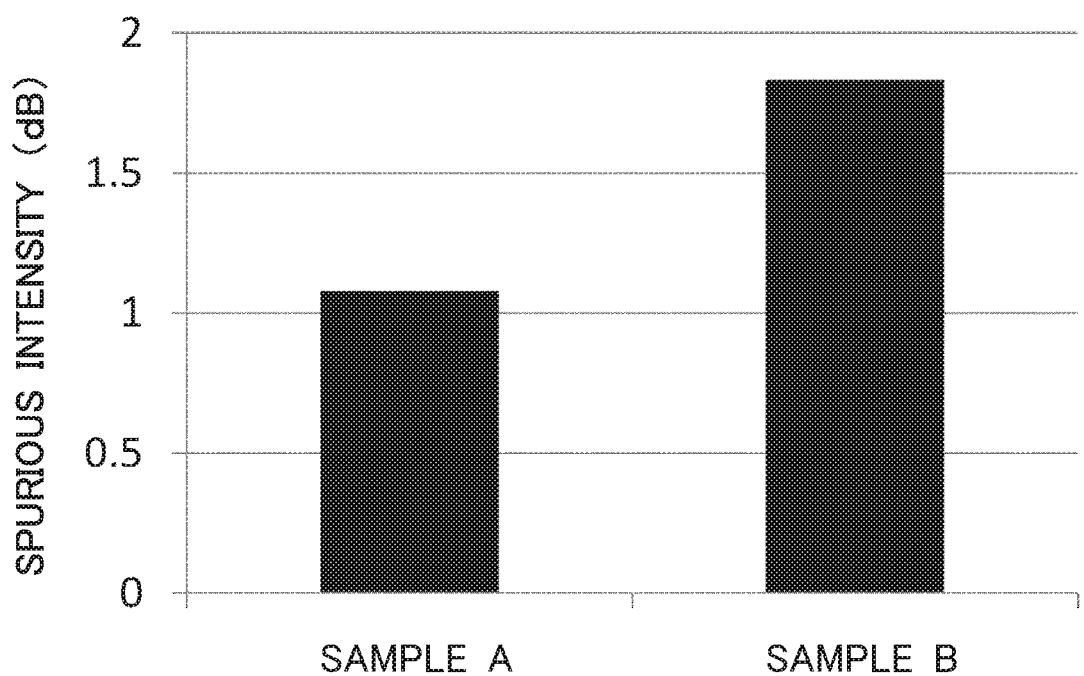
FIG. 5 is a diagram showing a difference in spurious intensity when each of the rough surfaces of FIG. 4 is formed.

In order to check the degree of influence of parameters, the intensity of spurious was firstly measured using two LT substrates whose surfaces were roughened to the same degree. FIGS. 4(a) and 4(b) show the surface texture of each of the samples observed with an atomic force microscope (AFM). FIG. 4(a) shows the surface texture of sample A, and the arithmetic average roughness Ra is 108 nm. FIG. 4(b) shows the surface texture of sample B, and the arithmetic average roughness Ra is 103 nm. Although the two samples have the same degree of the arithmetic average roughness Ra, the unevenness pitch is different between the samples as seen from FIG. 4. The roughened surfaces of the LT substrates were joined with flat surfaces of Si substrates as the support substrates with an adhesive. The LT substrates were thinned to a thickness of 20 μm to produce resonators. FIG. 5 shows the spurious measurement results of the resonators made from the samples. As is clear from the measurement results, even when the samples have the same degree of the arithmetic average roughness Ra, if the unevenness pitch is different between the samples, the intensity of spurious is different between the samples.

Figure 6:
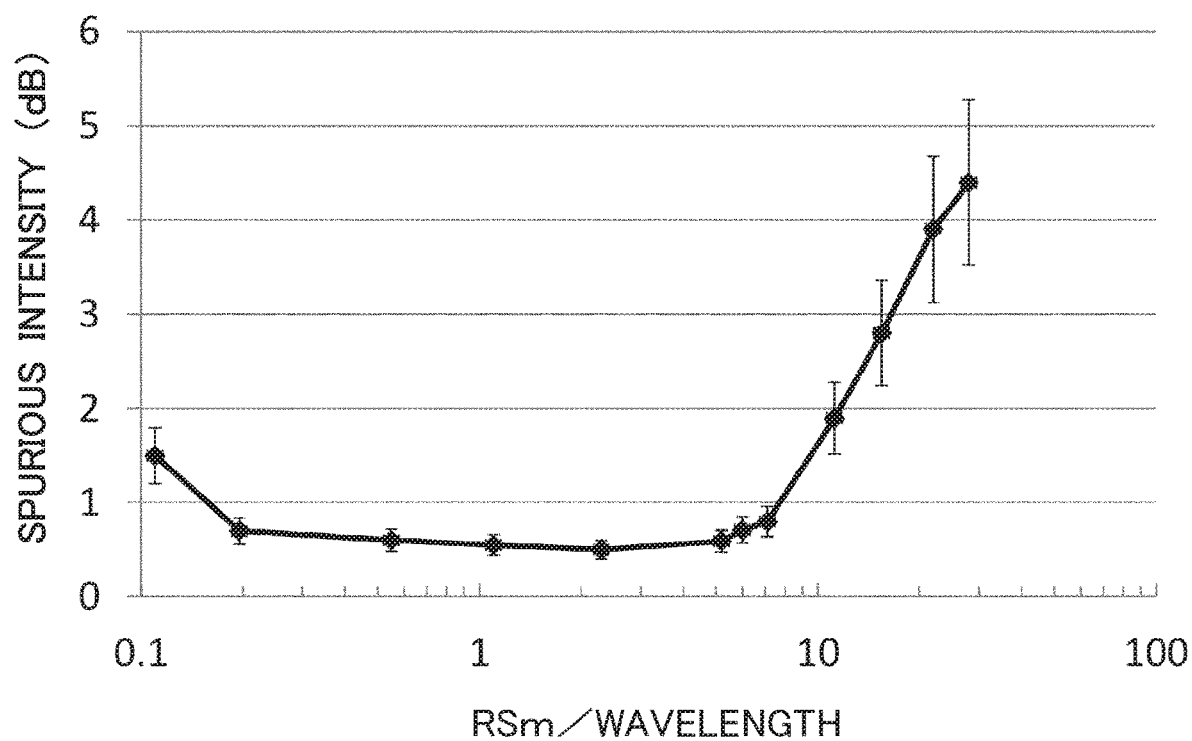
FIG. 6 is a diagram showing a relationship between roughness RSm/wavelength and spurious intensity when an LT substrate has a rough surface and a support substrate has a flat surface.

Then, a plurality of LT substrates having the same degree of roughness (at an arithmetic average roughness Ra of 300 nm±10%) and different unevenness pitches were provided, and a $SiO_2$ film (about 10 μm in thickness) was formed on the roughened surface of each of the LT substrates at 35° C. by a plasma CVD method. Then, the formed $SiO_2$ film was polished and flattened. Thereafter, both the flattened $SiO_2$ film and the flat surface of the Si substrate as the support substrate were subjected to a surface activation treatment and were joined with each other. The LT substrates were thinned to a thickness of 20 μm to produce resonators. Different unevenness pitches were formed using different free abrasive grains, and the arithmetic average roughness Ra was adjusted by adjusting the polishing time with free abrasive grains. FIG. 6 shows the measurement results of the spurious of a four-stage ladder filter made from each of the samples. The horizontal axis herein is a value obtained by dividing the roughness RSm (JIS roughness parameter representing the unevenness pitch) by a wavelength (here, 5 μm) when using the resonator constituting the four-stage ladder filter. The roughness RSm was calculated from a cross section of an AFM image of a 100×100 μm area. The measurement results show that the spurious can be effectively reduced when the value of roughness RSm/wavelength is 0.2 to 7. This is thought to be because scattering due to unevenness hardly occurs when the unevenness pitch is too large, whereas the wavelength is not affected by the unevenness when the unevenness pitch is too small. Even in the case where different wavelengths are used, it is possible to obtain the spurious reduction effect in the same range of the value of roughness RSm/wavelength.

Figure 7:
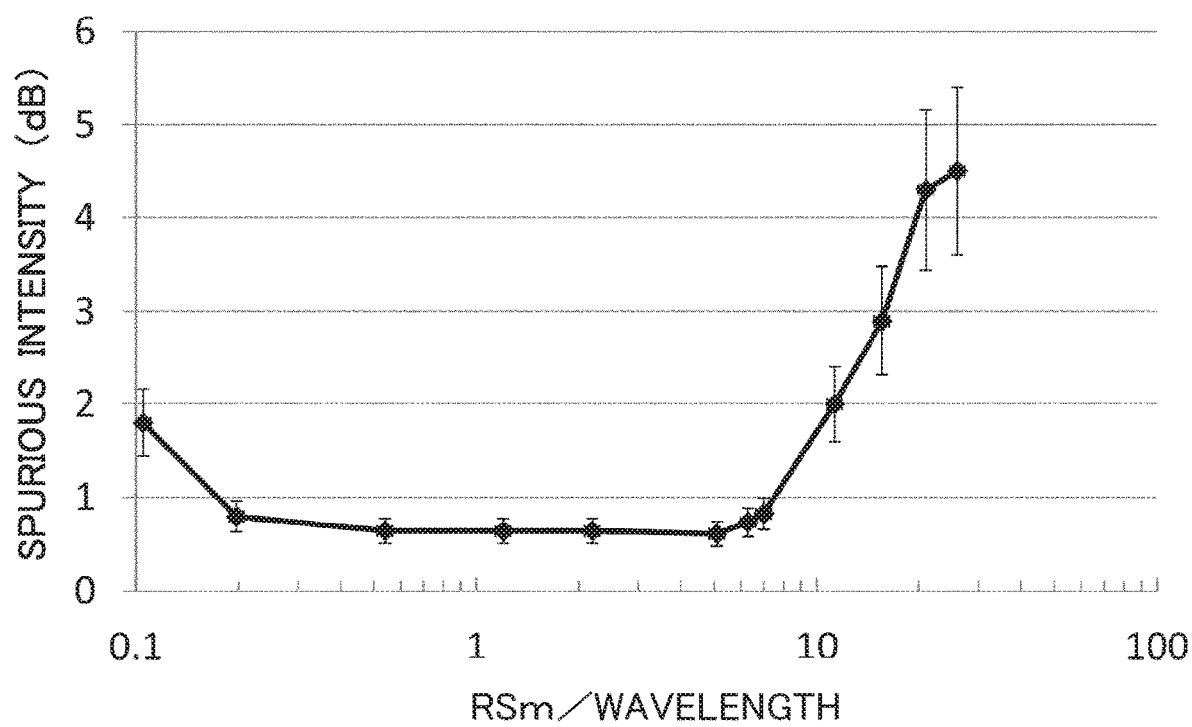
FIG. 7 is a diagram showing the relationship between roughness RSm/wavelength and spurious intensity when the LT substrate has a flat surface and the support substrate has a rough surface.
Figure 8:
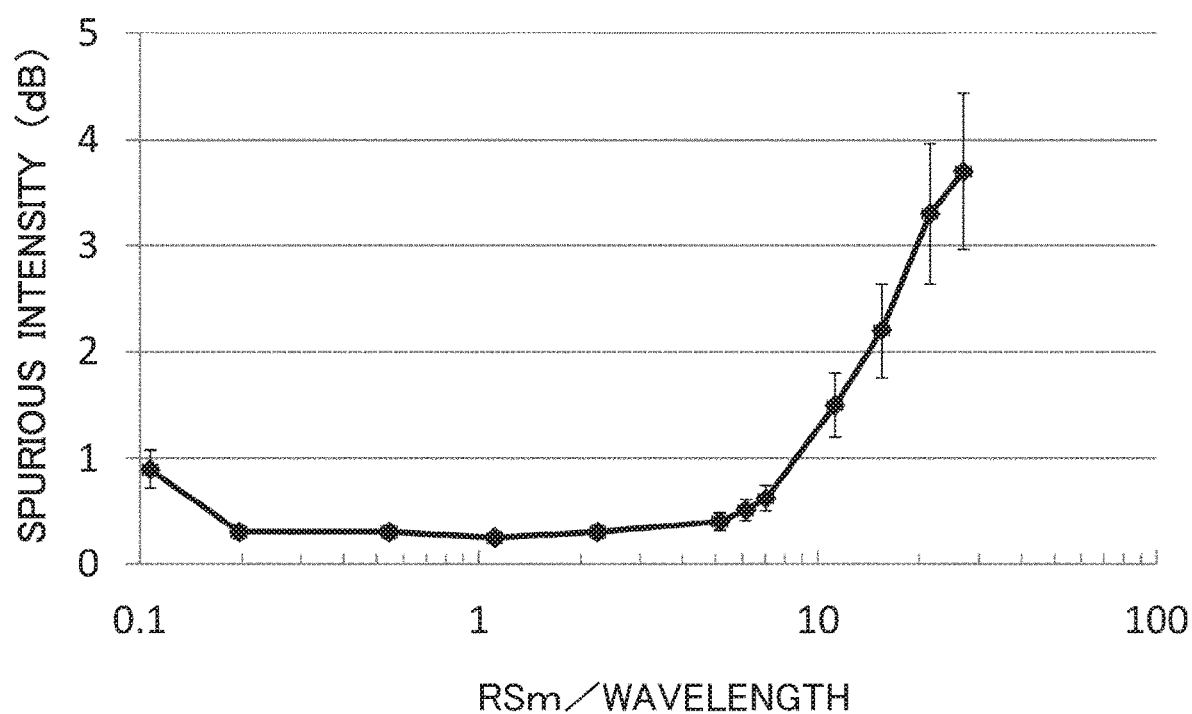
FIG. 8 is a diagram showing the relationship between roughness RSm/wavelength and spurious intensity when both the LT substrate and the support substrate have rough surfaces.

FIG. 7 shows the results obtained by performing a similar experiment for the case where a flat LT substrate and a support substrate were joined with each other, and FIG. 8 shows the results obtained by performing a similar experiment for the case where an LT substrate with a roughened surface and a support substrate with a roughened surface were joined with each other. In either case, it is possible to obtain the spurious reduction effect in the same range of the value of RSm/wavelength. Particularly, the greatest reduction effect can be obtained in the latter case.

Prior to joining of the piezoelectric single crystal substrate and the support substrate in which the inorganic material film is formed on at least one of the piezoelectric single crystal substrate and the support substrate, respective surfaces of the substrates to be joined are flattened, thereby making it easy to join the substrates.

At least one of the flattened surfaces to be joined is subjected to a surface activation treatment, thereby making it easier to join the surfaces. As the surface activation treatment to be used, for example, an ozone water treatment, a UV ozone treatment, an ion beam treatment or a plasma treatment is preferable.

For example, a chemical vapor deposition method (CVD method), a physical vapor deposition method (PVD method) or a method including applying an organosilicon compound solution and curing and firing the solution is preferable for the formation of the inorganic material film.

In the CVD method, a film can be effectively formed using a reaction gas containing silane.

Figure 9:
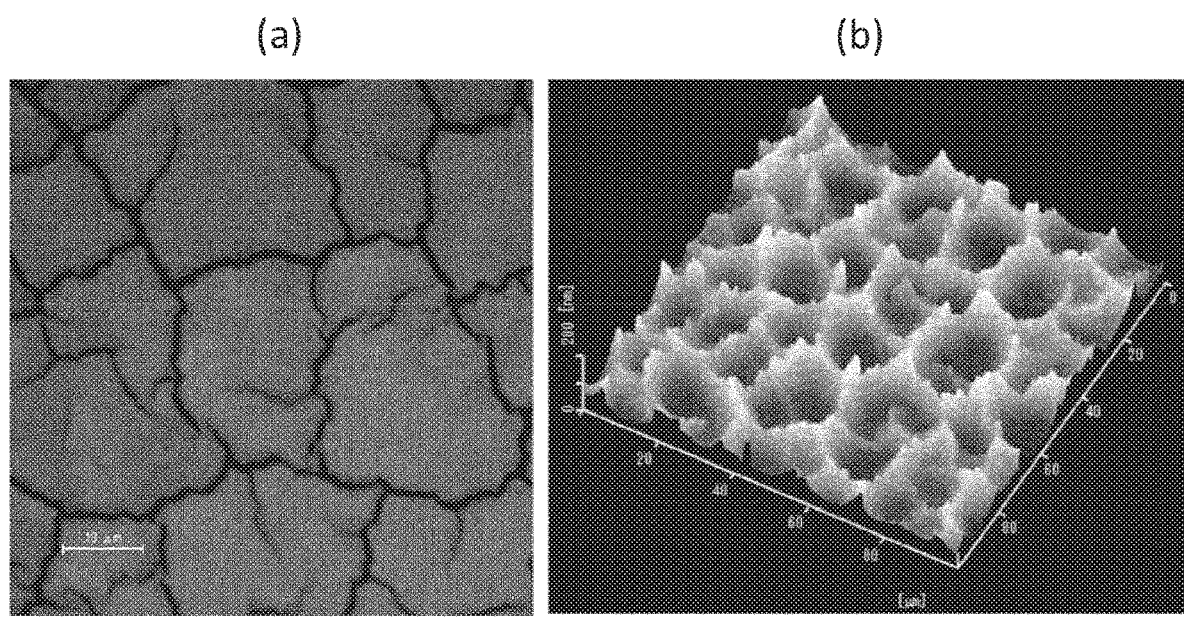
FIG. 9 shows views showing images when $SiO_2$ is deposited on the LT substrate.
Figure 10:
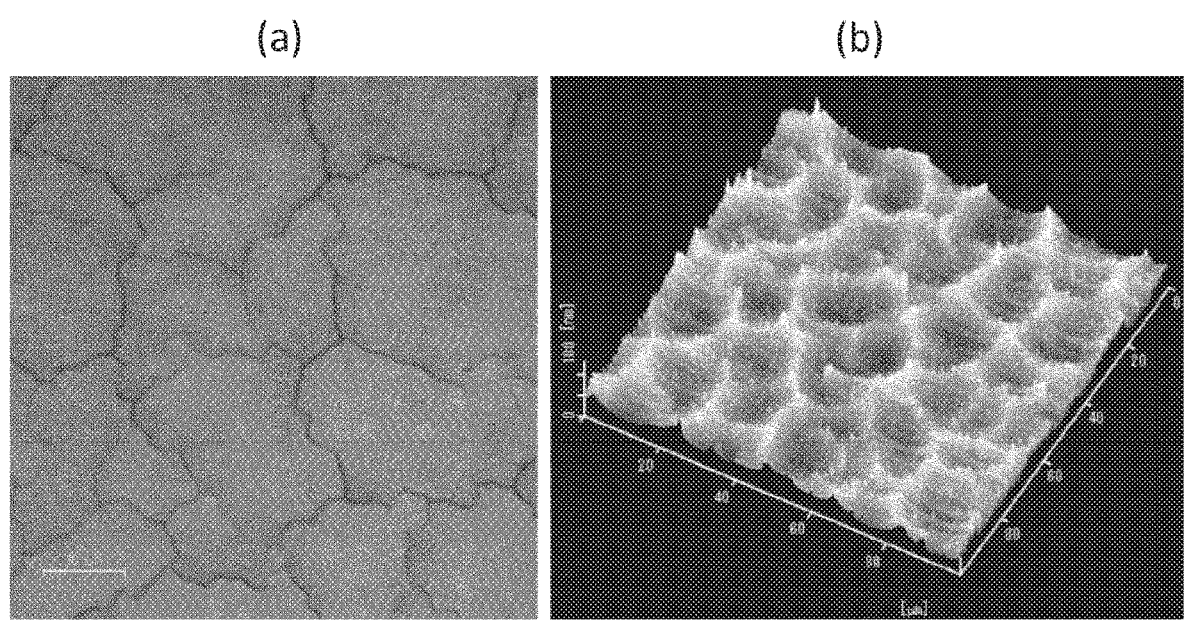
FIG. 10 shows views showing images when $SiO_2$ is deposited on a Si substrate.
Figure 14:
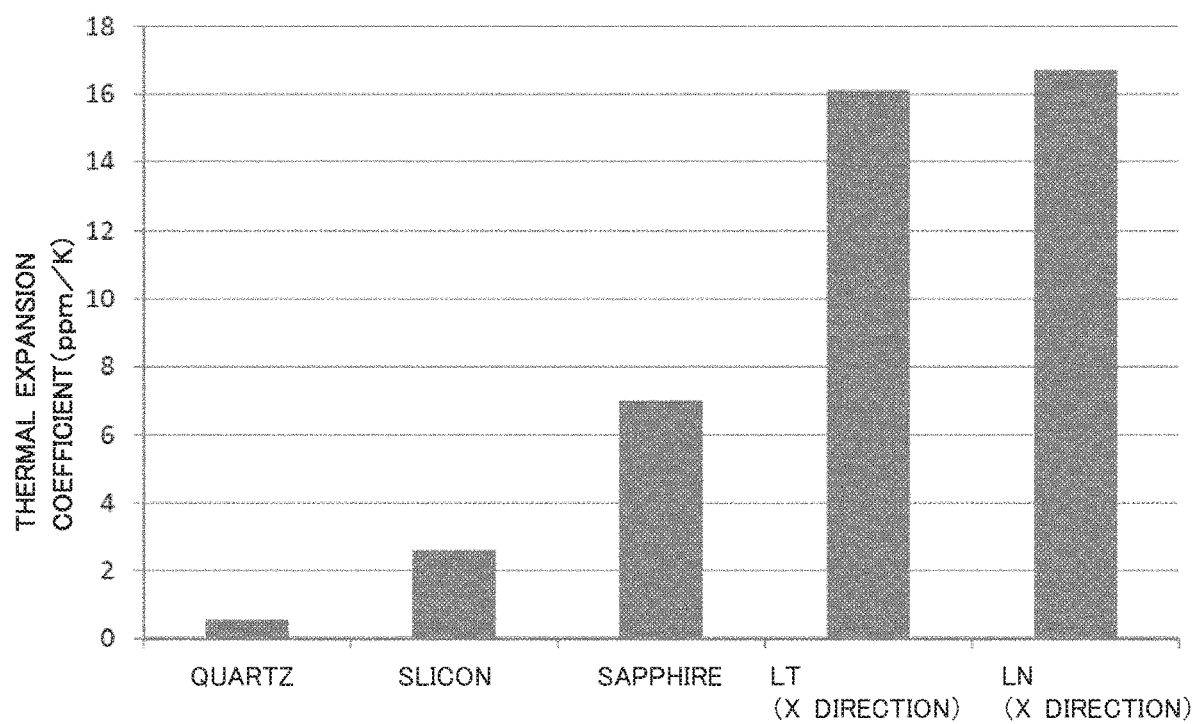
FIG. 14 is a diagram showing thermal expansion coefficients of various materials.
Figure 15:
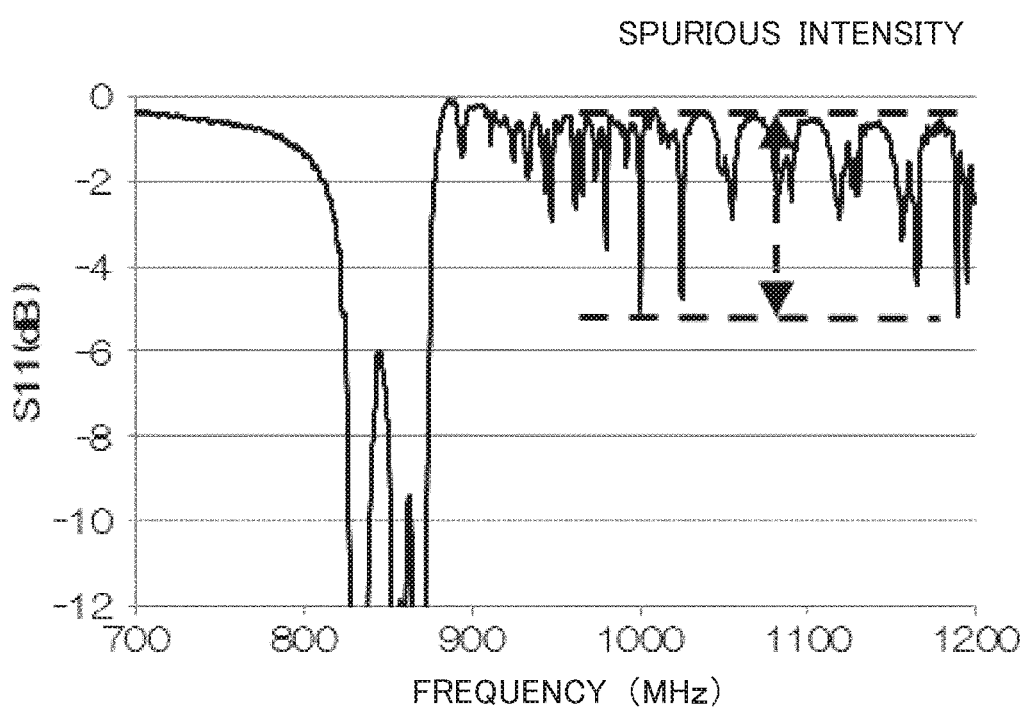
FIG. 15 shows diagrams showing an example of the return loss of a resonator that is formed in an LT film laminated on a silicon substrate.
Figure 15:
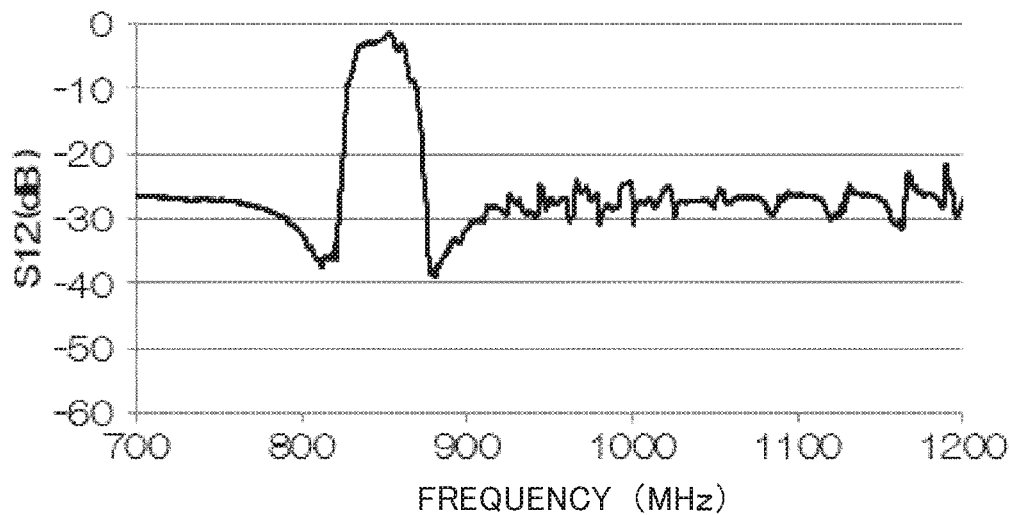

The CVD method is an excellent method as a method of depositing $SiO_2$. However, in the case where the film formation temperature exceeds 125 to 250° C., the warping and cracking of the substrate are significantly caused after the temperature of the film-formed substrate is returned to room temperature. As a result, it is difficult to perform mirror polishing. This affect is significant, particularly in the case of depositing $SiO_2$ on the LT substrate. For example, FIG. 9(a) shows a photograph observed with an optical microscope when a layer of $SiO_2$ with a thickness of about 10 μm was deposited on a 4-inch LT at a temperature of 350° C. by PECVD method and the temperature was returned to room temperature, and FIG. 9(b) shows an AFM image. As can be seen from FIG. 9, when the temperature is returned to room temperature after the deposition under high temperature, the substrate warps to the convex side, the $SiO_2$ film is subjected to a strong compressive stress, and thus the $SiO_2$ film cannot be shrunk and swells like a mesh. Even in the case of depositing $SiO_2$ on Si by the same method, although the degree is light, the same phenomenon occurs, as shown in FIG. 10(a) (photograph observed with the optical microscope) and FIG. 10(b) (AFM image). The difference in the degree of this phenomenon is attributed to the fact that the difference between the expansion coefficients of Si and $SiO_2$ is about 2 ppm/K, whereas the difference between the expansion coefficients of LT and $SiO_2$ is about 15 ppm/K, which is extremely large (see FIG. 14).

In the case of forming an inorganic material film by the CVD method, the film formation temperature is preferably lowered so that $\Delta T$ (=film formation temperature–room temperature) and $\Delta E$ (=the thermal expansion coefficient of the substrate/thermal expansion coefficient of the inorganic material film) satisfy the relationship of $\Delta T \cdot \Delta E \leq 3500$ ppm. It is more preferable that the relationship of $\Delta T \cdot E \leq 750$ ppm is satisfied. In the case of forming a $SiO_2$ film on the LT substrate, although the film formation temperature depends on the film formation thickness, the temperature is preferably 250° C. or lower, and more preferably 70° C. or lower. Among the specific methods of the CVD method, a low-temperature CVD method, a low-temperature PECVD method or an ICP-CVD method capable of lowering the reaction temperature by decomposing the gas by inductively coupled plasma (ICP) is preferable in order to satisfy the above condition.

Figure 11:
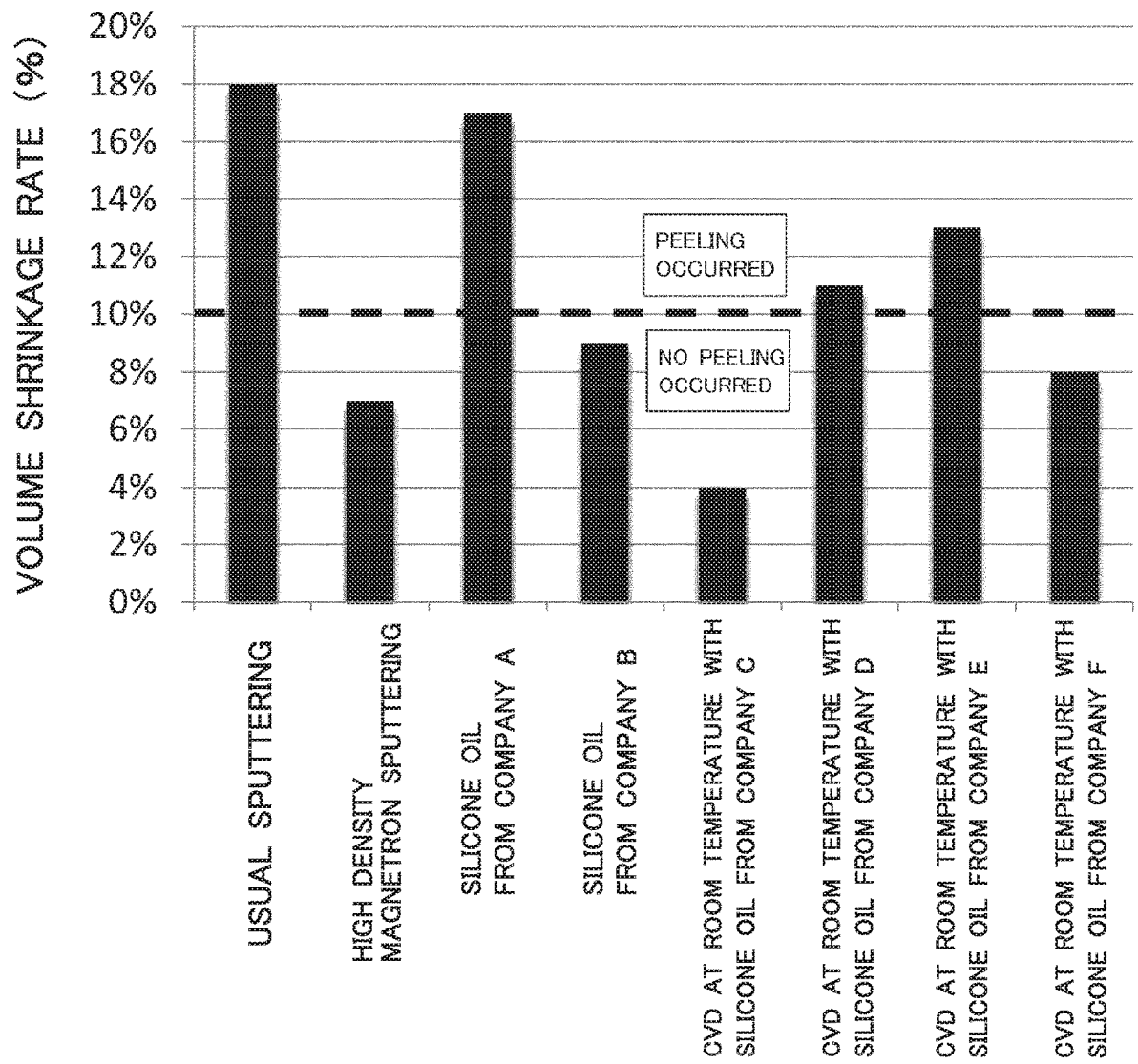
FIG. 11 is a diagram showing a relationship between the volume shrinkage rate of an inorganic material film and the presence or absence of film peeling.

When a large amount of impurities (such as hydrogen and moisture) are contained in the formed inorganic material film, a volatile component called outgas is generated from the film and the reliability is lowered. Therefore, it is necessary to form a high-purity film. For example, an LT substrate and each of $SiO_2$ substrates formed by various kinds of methods were joined with an inorganic material film interposed therebetween, and the LT substrate was thinned to a thickness of 10 μm, and a heat treatment at 400° C. for 12 hours was attempted. The results are shown in FIG. 11. As is clear from FIG. 11, film peeling occurs in the substrates having a volume shrinkage of 10% or more after the heat treatment. It is considered that this is because impurities in the film generate outgas and the outgas reaches the joined interface, thereby causing film peeling.

In the PVD method, it is possible, for example, to just grow a film at room temperature by a sputtering method. However, since the formed film is not dense, it is necessary to densify the film. At this time, the volume of the film shrinks and the stress of the film is relaxed at the densification temperature. Thus, when the temperature is returned to room temperature, warping and cracking of the substrate are likely to occur. Then, the magnetron sputtering method capable of obtaining a highly dense film may be used to avoid performing the densification process and to prevent the occurrence of warping of the substrate due to relaxation of stress after the densification process.

In the case where a wafer is coated with a solution of an organosilicon compound (alkoxysilane, silazane, siloxane, and the like) and fired, since the purpose of curing the organosilicon compound at the time of film formation is to volatilize the solvent and the curing is just pre-curing, it is preferable to cure the organosilicon compound, for example, at a low temperature of 250° C. or lower. Further, the pre-cured organosilicon compound at the time of film formation is fired preferably at a temperature of, for example, 600° C. or lower so that the piezoelectric single crystal film is not easily peeled off due to excessive volume shrinkage. Furthermore, a volume shrinkage rate during a period of curing the organosilicon compound and firing the organosilicon compound is equal to or less than 10% so that it is possible to make it difficult for the piezoelectric single crystal film to peel off. The organosilicon compound capable of reducing the volume shrinkage rate to equal to or less than 10% is, for example, an organosilicon compound containing perhydropolysilazane or methyltrimethoxysilane. A volume shrinkage ratio of about 7% can be expected in the case of perhydropolysilazane and a volume shrinkage rate of about 9% can be expected in case of methyltrimethoxysilane.

In order to achieve good mirror polishing, the thickness of the inorganic material film is preferably equal to or more than about 20 times the arithmetic average roughness Ra of the rough surface of the base or equal to or more than about 2 times a maximum height Rz. Further, the long-pitch roughness component in the lateral direction of the rough surface of the base tends to be unlikely to be flattened. Particularly, when the roughness RSm is several tens μm, an influence is caused. In that case, for example, the thickness of the film is preferably equal to or more than 0.2 times the roughness RSm.

Note that the present invention is not limited to the above embodiments. The above embodiments are merely illustrative, and the technical scope of the present invention encompasses any equivalents that have substantially the same configuration as the technical idea described in the claims of the present invention and can achieve similar effects.

EXAMPLES

Figure 12:
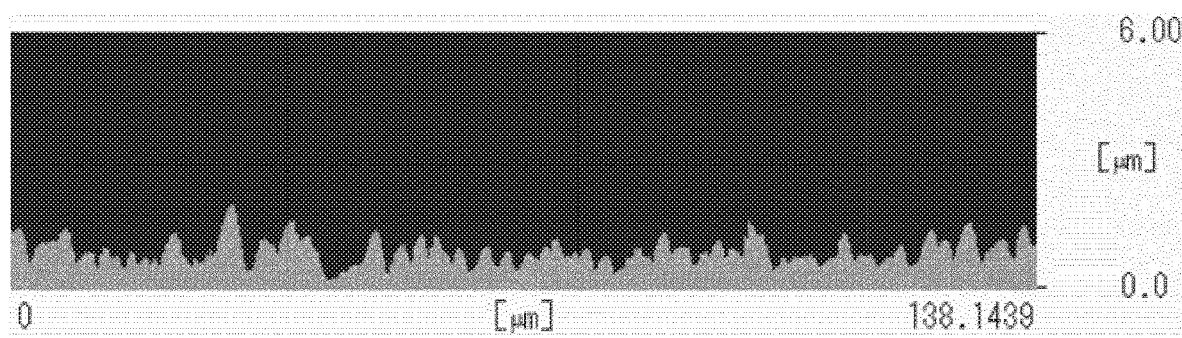
FIG. 12 is a view of an example of a cross-sectional profile obtained by measuring the uneven structure on the surface of the silicon substrate produced in each of the examples using an atomic force microscope (AFM).
Figure 13:
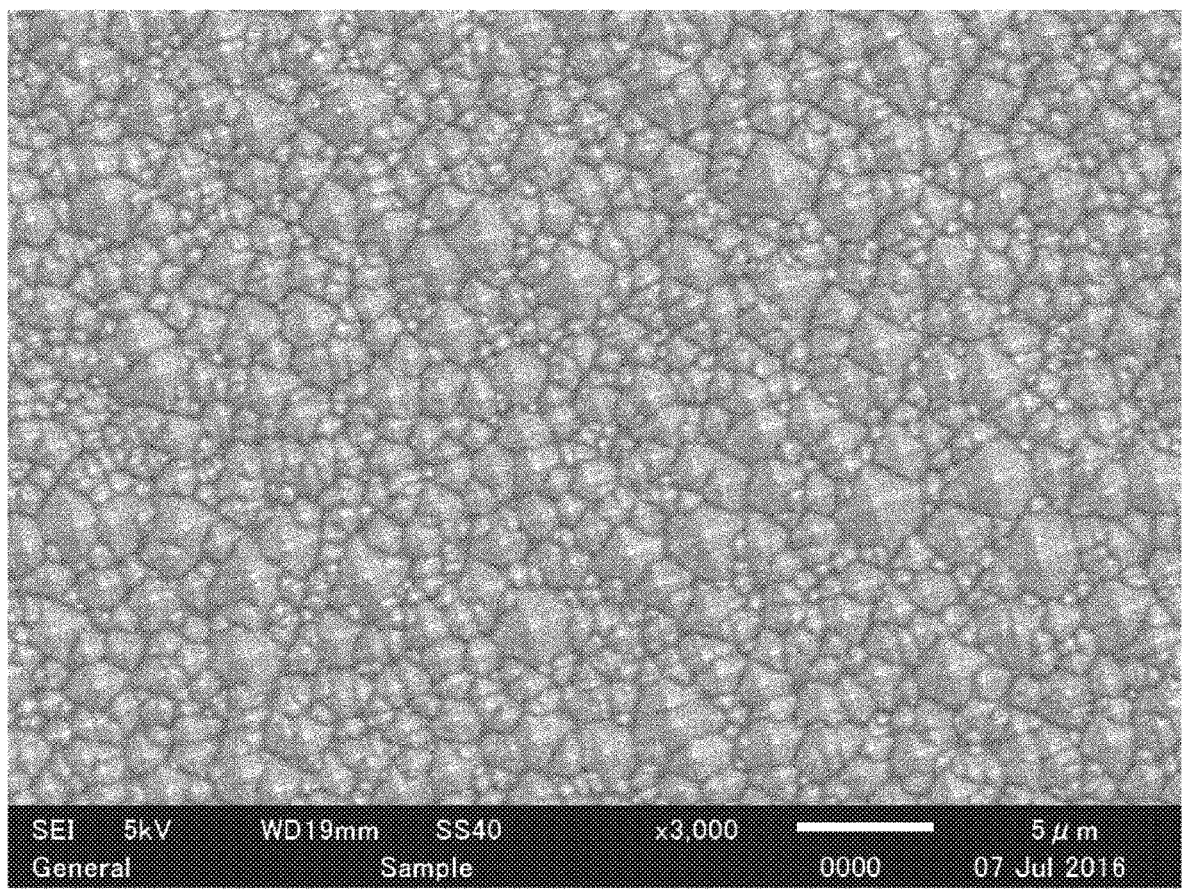
FIG. 13 is a view of an example of an image of the uneven structure on the surface of the silicon substrate produced in each of the examples, which is observed using a scanning electron microscope (SEM).

A 4000 μm-thick silicon substrate (Si) having a diameter of 100 mm was used as the support substrate, and a 0.30 mm-thick lithium tantalate (LT) having a diameter of 100 mm was used as the piezoelectric single crystal substrate. The silicon substrate was immersed in a 2 wt % sodium hydroxide solution at 50 to 90° C. and treated for 5 to 20 minutes to form an uneven structure on the surface of the silicon substrate. The uneven structure on the surface of the lithium tantalate substrate was produced by polishing the substrate with free abrasive grains. An AFM image of a 100×100 μm area for the surfaces of the uneven structure was measured, and the arithmetic average roughness Ra and roughness RSm of each of the surfaces were calculated from data on the cross section of each of the surfaces in accordance with the calculation method prescribed in ISO 4287: 1997 (corresponding to JIS B0601: 2001). FIGS. 12 and 13 each show an example of a cross-sectional profile obtained by measuring an uneven structure of a surface of a silicon substrate produced by immersing a (100) plane silicon substrate (mirror surface) in a sodium hydroxide solution at 86° C. for 10 minutes using an atomic force microscope (AFM) and an example of an image of the uneven structure observed using a scanning electron microscope (SEM). FIG. 12 shows the case where the roughness RSm is equal to 3 μm and the arithmetic average roughness Ra is equal to 280 nm.

As the inorganic material film, a $SiO_2$ film was formed on a rough surface having an uneven structure. The $SiO_2$ film is usually formed by usual sputtering, high density magnetron sputtering, firing an organosilicon compound (a dibutyl ether solution of perhydropolysilazane: ANN 120-20, manufactured by AZ Electronic Materials Co., Ltd., was used in Examples 5, 6 and 20, and a propylene glycol monoethyl ether solution of methyltrimethoxysilane: KBM-13, manufactured by Shin-Etsu Chemical Co., Ltd., was used in Examples 7, 8, and 21), low-temperature CVD, and PECVD so as to have a thickness of about 10 μm (26 μm and 30 μm for Examples 20 and 21, respectively). Thereafter, the formed film was polished to form a mirror surface.

Plasma activation was applied to the mirror surfaces of both the support substrate and the piezoelectric single crystal substrate to join the substrates. The portion of the piezoelectric single crystal substrate of the joined body was polished to be thinned to a thickness of 10 μm.

In accordance with the above production method, a plurality of composite substrates for surface acoustic wave device was produced by changing parameter values to 23 different values (21 different values in the examples and 2 different values in the comparative examples). Whether or not each of the produced composite substrates for surface acoustic wave device could withstand heating in the subsequent step was determined by a heat treatment at 400° C. for 12 hours. Regarding the comparative examples, a UV curing epoxy resin adhesive was used instead of forming the $SiO_2$ film. Table 1 shows the determination results of the examples.

TABLE 1

Forming a SiO2 film on a rough surface (adhered to the rough surface)

| | Support substrate | | Piezoelectric single crystal substrate | | | | Film formation (adhesion) method[° C.] | Bonded substrate | |
|---|---|---|---|---|---|---|---|---|---|
| | Ra [nm] | RSm [μm] | Ra [nm] | RSm [μm] | Rough surface | Film formation (adhesion) method | | Bonding | Heat test at 400° C. |
| Example 1 | 300 | 0.55 | <1 (Mirror surface) | — (Mirror surface) | Support substrate | Sputtering | Sputtering 20 Densifying 250 | Good | Partially peeled |
| Example 2 | <1 (Mirror surface) | — (Mirror surface) | 100 | 0.55 | Piezoelectric single crystal substrate | Sputtering | Sputtering 20 Densifying 250 | Good | Partially peeled |
| Example 3 | 310 | 35 | <1 (Mirror surface) | — (Mirror surface) | Support substrate | High density magnetron sputtering | 30 | Good | Non-peeled |
| Example 4 | <1 (Mirror surface) | — (Mirror surface) | 140 | 0.55 | Piezoelectric single crystal substrate | High density magnetron sputtering | 30 | Good | Non-peeled |
| Example 5 | 300 | 130 | <1 (Mirror surface) | — (Mirror surface) | Support substrate | Applying and firing perhydropolysilazane (solvent: dibutyl ether) | Applying 25 Pre-curing 180 Heat-treating 600 | Good | Partially peeled |
| Example 6 | <1 (Mirror surface) | — (Mirror surface) | 300 | 1 | Piezoelectric single crystal substrate | Applying and firing perhydropolysilazane (solvent: dibutyl ether) | Applying 25 Pre-curing 180 Heat-treating 600 | Good | Non-peeled |
| Example 7 | 300 | 130 | <1 (Mirror surface) | — (Mirror surface) | Support substrate | Applying and firing methyltrimethoxysilane (solvent: propylene glycol monoethyl ether) | Applying 25 Pre-curing 160 Heat-treating 600 | Good | Partially peeled |
| Example 8 | <1 (Mirror surface) | — (Mirror surface) | 300 | 1 | Piezoelectric single crystal substrate | Applying and firing methyltrimethoxysilane (solvent: propylene glycol monoethyl ether) | Applying 25 Pre-curing 160 Heat-treating 600 | Good | Non-peeled |
| Example 9 | 280 | 3 | <1 (Mirror surface) | — (Mirror surface) | Support substrate | ICPCVD ($SiH_4$ + $O_2$ Atmosphere) | 35 | Good | Non-peeled |
| Example 10 | <1 (Mirror surface) | — (Mirror surface) | 300 | 1 | Piezoelectric single crystal substrate | ICPCVD ($SiH_4$ + $O_2$ Atmosphere) | 35 | Good | Non-peeled |
| Example 11 | 300 | 1 | 300 | 1 | Support substrate Piezoelectric single crystal substrate | ICPCVD ($SiH_4$ + $O_2$ Atmosphere) | 35 | Good | Non-peeled |

TABLE 1-continued

| | Support substrate | | Piezoelectric single crystal substrate | | Forming a SiO2 film on a rough surface (adhered to the rough surface) | | | Bonded substrate | |
|---|---|---|---|---|---|---|---|---|---|
| | Ra [nm] | RSm [µm] | Ra [nm] | RSm [µm] | Rough surface | Film formation (adhesion) method | Film formation (adhesion) method [° C.] | Bonding | Heat test at 400° C. |
| Example 12 | 305 | 1 | <1 (Mirror surface) | — (Mirror surface) | Support substrate | ICPCVD (SiH₄ + O₂ Atmosphere) | 70 | Good | Non-peeled |
| Example 13 | <1 (Mirror surface) | — (Mirror surface) | 300 | 1 | Piezoelectric single crystal substrate | ICPCVD (SiH₄ + O₂ Atmosphere) | 70 | Good | Non-peeled |
| Example 14 | 300 | 6 | <1 (Mirror surface) | — (Mirror surface) | Support substrate | PECVD (SiH₄ + N₂O Atmosphere) | 75 | Approved | Hardly peeled |
| Example 15 | <1 (Mirror surface) | — (Mirror surface) | 130 | 5.5 | Piezoelectric single crystal substrate | PECVD (SiH₄ + N₂O Atmosphere) | 75 | Approved | Hardly peeled |
| Example 16 | 330 | 6 | <1 (Mirror surface) | — (Mirror surface) | Support substrate | PECVD (SiH₄ + N₂O Atmosphere) | 125 | Approved | Partially peeled |
| Example 17 | <1 (Mirror surface) | — (Mirror surface) | 130 | 5.5 | Piezoelectric single crystal substrate | PECVD (SiH₄ + N₂O Atmosphere) | 125 | Partially approved | Partially peeled |
| Example 18 | 320 | 5.6 | 130 | 5.6 | Support substrate Piezoelectric single crystal substrate | PECVD (SiH₄ + N₂O Atmosphere) | 125 | Partially approved | Partially peeled |
| Example 19 | 300 | 6 | <1 (Mirror surface) | — (Mirror surface) | Support substrate | PECVD (SiH₄ + N₂O Atmosphere) | 250 | Partially approved | Partially peeled |
| Example 20 | 300 | 130 | <1 (Mirror surface) | — (Mirror surface) | Support substrate | Applying and firing perhydropolysilazane (solvent: dibutyl ether) | Applying 25 Pre-curing 180 Heat-treating 600 | Good | Non-peeled |
| Example 21 | 300 | 130 | <1 (Mirror surface) | — (Mirror surface) | Support substrate | Applying and firing methyltrimethoxysilane (solvent: propylene glycol monoethyl ether) | Applying 25 Pre-curing 160 Heat-treating 600 | Good | Non-peeled |
| Comparative Example 1 | 300 | 0.55 | <1 (Mirror surface) | — (Mirror surface) | Support substrate | Adhesive (UV curing epoxy) | 25 | (Adhesion) | The entire surface peeled |
| Comparative Example 2 | <1 (Mirror surface) | — (Mirror surface) | 100 | 0.55 | Piezoelectric single crystal substrate | Adhesive (UV curing epoxy) | 25 | (Adhesion) | The entire surface peeled |

The piezoelectric single crystal substrate was joined with the support substrate with the inorganic material film interposed therebetween, whereby a composite substrate was obtained in which the entire surface was not peeled off even by heating at 400° C., unlike the case of bonding the substrates with the adhesive.

In the case of film formation by the PVD method (Examples 1 to 4), composite substrates could be formed without peeling because high density magnetron sputtering was performed. In any of the film formation methods, the results were not affected by the kind of the substrate on which the rough surface was formed.

In the case of applying an organosilicon compound solution to a wafer and firing the wafer (Examples 5 to 8), composite substrates could be formed without peeling by forming a rough surface on the piezoelectric single crystal substrate. Further, even when the rough surface was formed on the support substrate, and the film was formed to have a thickness of equal to or more than the roughness RSm×0.2 (Examples 20 and 21), and thus composite substrates could be formed without film peeling.

In the case of film formation by the CVD method, when the film formation temperature was 70° C. or lower (Examples 9 to 13), the composite substrates could be formed without film peeling in any of the film formation methods. When the film formation temperature is 75° C. (Examples 14 and 15), a certain degree of film peeling occurs. Although the bonding can be performed, the state of bonding is slightly deteriorated. When the film formation temperature reaches 125° C. or higher (Examples 16 to 19), the film is partially peeled off, and the influence of warping of the substrate is remarkable. In the case of 125° C., when a rough surface is formed only on the support substrate, bonding can be performed. However, when the rough surface is formed on the piezoelectric single crystal substrate, reliable bonding cannot be performed. Further, in the case where the film formation temperature is 250° C., reliable bonding cannot be performed even when the rough surface is formed only on the support substrate.

As described above, according to the production method of the present invention, the peeling of the entire surface of the piezoelectric single crystal film can be suppressed, and good products can be produced under a wide range of conditions by appropriately setting the parameters.

REFERENCE SIGNS LIST

10 Piezoelectric single crystal substrate
11, 21 Uneven structure
12, 22 Flat surface
20 Support substrate 30 Inorganic material film
32 Flattened surface

The invention claimed is:
1. A method of producing a composite substrate for surface acoustic wave device, comprising:
providing a piezoelectric single crystal substrate and a support substrate;
forming a film made of inorganic material on at least one of the piezoelectric single crystal substrate and the support substrate; and
joining the piezoelectric single crystal substrate with the support substrate so as to sandwich the film made of the inorganic material;
wherein
an uneven structure is formed on at least one of the piezoelectric single crystal substrate and the support substrate,
the film made of the inorganic material is formed on the uneven structure, and
a numerical value of roughness RSm/wavelength, which is a ratio of the roughness RSm of the uneven structure to the wavelength when the substrate is used as a surface acoustic wave device, is equal to or more than 0.2 and equal to or less than 7.

2. The method of producing a composite substrate for surface acoustic wave device according to claim 1, wherein a roughness Ra of the uneven structure is equal to or more than 100 nm.

3. The method of producing a composite substrate for surface acoustic wave device according to claim 1, wherein prior to joining of the piezoelectric single crystal substrate and the support substrate, in which the film made of inorganic material is formed on at least one of the piezoelectric single crystal substrate and the support substrate, respective surfaces of the piezoelectric single crystal substrate and the support substrate to be joined are flattened.

4. The method of producing a composite substrate for surface acoustic wave device according to claim 3, wherein at least one of the flattened surfaces to be joined is subjected to a surface activation treatment and then the respective surfaces are joined.

5. The method of producing a composite substrate for surface acoustic wave device according to claim 4, wherein the surface activation treatment is any one of an ozone water treatment, a UV ozone treatment, an ion beam treatment, and a plasma treatment.

6. The method of producing a composite substrate for surface acoustic wave device according to claim 1, wherein the inorganic material film is formed by a chemical vapor deposition method.

7. The method of producing a composite substrate for surface acoustic wave device according to claim 6, wherein a reaction gas in the chemical vapor deposition method includes silane.

8. The method of producing a composite substrate for surface acoustic wave device according to claim 6, wherein the inorganic material film is formed at 70° C. or lower.

9. The method of producing a composite substrate for surface acoustic wave device according to claim 6, wherein a volume shrinkage rate of the formed inorganic material film when heated to a temperature of from 400 to 600° C. is equal to or less than 10%.

10. The method of producing a composite substrate for surface acoustic wave device according to claim 1, wherein the inorganic material film is formed by a physical vapor deposition method.

11. The method of producing a composite substrate for surface acoustic wave device according to claim 10, wherein the physical vapor deposition method is a magnetron sputtering method.

12. The method of producing a composite substrate for surface acoustic wave device according to claim 1, wherein the inorganic material film is formed by applying an organosilicon compound solution to a surface on which the uneven structure is formed, and curing and firing the organosilicon compound solution.

13. The method of producing a composite substrate for surface acoustic wave device according to claim 12, wherein the organosilicon compound solution is cured at a temperature of 250° C. or lower.

14. The method of producing a composite substrate for surface acoustic wave device according to claim 12, wherein the organosilicon compound solution is fired at a temperature of 600° C. or lower.

15. The method of producing a composite substrate for surface acoustic wave device according to claim 12, wherein a volume shrinkage rate during a period of curing the organosilicon compound solution and firing the organosilicon compound solution is equal to or less than 10%.

16. The method of producing a composite substrate for surface acoustic wave device according to claim 12, wherein the organosilicon compound solution contains perhydropolysilazane or methyltrimethoxysilane.

17. The method of producing a composite substrate for surface acoustic wave device according to claim 1, wherein material of the piezoelectric single crystal substrate is lithium tantalate or lithium niobate.

18. The method of producing a composite substrate for surface acoustic wave device according to claim 1, wherein material of the support substrate is any one of silicon, silicon with an oxide film, glass, quartz, alumina, sapphire, silicon carbide, and silicon nitride.

19. The method of producing a composite substrate for surface acoustic wave device according to claim 1, wherein the inorganic material is any one of SiOx (x=2±0.5), SiON, SiN, amorphous Si, polycrystalline Si, and amorphous SiC.

* * * * *